United States Patent
Kim et al.

(10) Patent No.: US 10,078,389 B2
(45) Date of Patent: Sep. 18, 2018

(54) DISPLAY DEVICE AND MANUFACTURING METHOD THEREOF

(71) Applicant: LG DISPLAY CO., LTD., Seoul (KR)

(72) Inventors: Jinwoo Kim, Gwangju-si (KR); Seongtae Cho, Goyang-si (KR); Suchan Kwon, Seoul (KR); Daeun Min, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/362,039

(22) Filed: Nov. 28, 2016

(65) Prior Publication Data

US 2017/0153734 A1    Jun. 1, 2017

(30) Foreign Application Priority Data

Nov. 27, 2015  (KR) .................. 10-2015-0167651

(51) Int. Cl.
   *G06F 3/041*   (2006.01)
   *G06F 3/044*   (2006.01)
   *G04G 21/08*   (2010.01)
   *H01L 27/32*   (2006.01)
   *H01L 51/52*   (2006.01)
   *H01L 51/56*   (2006.01)

(52) U.S. Cl.
   CPC ............ *G06F 3/0412* (2013.01); *G06F 3/044* (2013.01); *G04G 21/08* (2013.01); *G06F 2203/04103* (2013.01); *H01L 27/323* (2013.01); *H01L 27/3211* (2013.01); *H01L 51/5246* (2013.01); *H01L 51/5293* (2013.01); *H01L 51/56* (2013.01); *H01L 2251/5338* (2013.01)

(58) Field of Classification Search
   CPC ................... G06F 3/0412; G06F 3/044; G06F 2203/04103; G04G 21/08; H01L 27/3211; H01L 27/323; H01L 51/5246; H01L 51/5293; H01L 51/56; H01L 2251/5338
   See application file for complete search history.

(56) References Cited

U.S. PATENT DOCUMENTS

2007/0176550 A1* 8/2007 Kwan ................. H01L 51/5246
                                              313/512
2014/0092041 A1* 4/2014 Ih ............................ G06F 3/044
                                              345/173

\* cited by examiner

*Primary Examiner* — Tom Sheng
(74) *Attorney, Agent, or Firm* — Birch, Stewart, Kolasch & Birch, LLP

(57) ABSTRACT

The present disclosure provides a display device that includes a first lower film, a second lower film extended toward one side of the first lower film, and a third lower film extended toward another side of the first lower film; a first upper film, a second upper film extended toward one side of the first upper film, and a third upper film extended toward another side of the first upper film; subpixels formed between the first lower film and the first upper film; and a sealing layer formed between the first to third lower films and the first to third upper films.

8 Claims, 7 Drawing Sheets

DISPLAY DEVICE AND MANUFACTURING METHOD THEREOF

This application claims the priority benefit of Korean Patent Application No. 10-2015-0167651, filed on Nov. 27, 2015, which is incorporated herein by reference for all purposes as if fully set forth herein.

BACKGROUND OF THE INVENTION

Field of the Invention

The present disclosure relates to a display device and a manufacturing method thereof.

Related Art

With the advancement of information technologies, there are increasing demands for display devices which are used as a medium that enables a user to access information. Accordingly, display devices such as an Organic Light Emitting Display (OLED), a Quantum Dot Display (QDD), and a Liquid Crystal Display (LCD), and a Plasma Display Panel (PDP), are widely used.

Such a display device includes a display panel having a plurality of subpixels, a driver for outputting a driving signal to drive the display panel, and a power supply unit for generating power to be supplied to the driver.

There are small-sized, medium-sized, and large-sized display devices. According to size, shape, and an application, it may be necessary to bend part of a display panel or part of a film connected to the display panel.

If there is a bending area on a display panel, it may add to difficulty to the attachment procedure. In addition, a crack in a signal line could occur, so it may be regarded as a challenge of process control and quality control. Therefore, if the display panel has the bending area, there is a need of a design method by which difficulties in the attachment process or a crack in a signal line could be prevented.

SUMMARY OF THE INVENTION

The embodiments of the present disclosure provide a display device which addresses the limitations and disadvantages associated with the related art display devices.

In one general aspect, there is provided a display device including a first lower film, a second lower film extended toward one side of the first lower film, and a third lower film extended toward the other side of the first lower film; a first upper film, a second upper film extended toward one side of the first upper film, and a third upper film extended toward the other side of the first upper film; subpixels formed between the first lower film and the first upper film; and a sealing layer formed between the first to third lower films and the first to third upper films.

In another general aspect, there is provided a method of manufacturing a display device, the method including forming subpixels on a lower film; performing a bonding and sealing procedure of disposing an upper film on the lower film and providing a sealing layer between the lower film and the upper film; and performing a film cutting procedure so that the lower film has a first lower film, a second lower film extended toward one side of the first lower film, and a third lower film extended toward the other side of the first lower film, and the upper film has a first upper film, a second upper film extended toward one side of the first upper film, and a third upper film extended toward the other side of the first upper film.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention.

DESCRIPTION OF EXEMPLARY EMBODIMENTS

Reference will now be made in detail embodiments of the invention examples of which are illustrated in the accompanying drawings.

Hereinafter, the detailed embodiments of the present disclose are decried with reference to the accompanying drawings.

Figure 1:
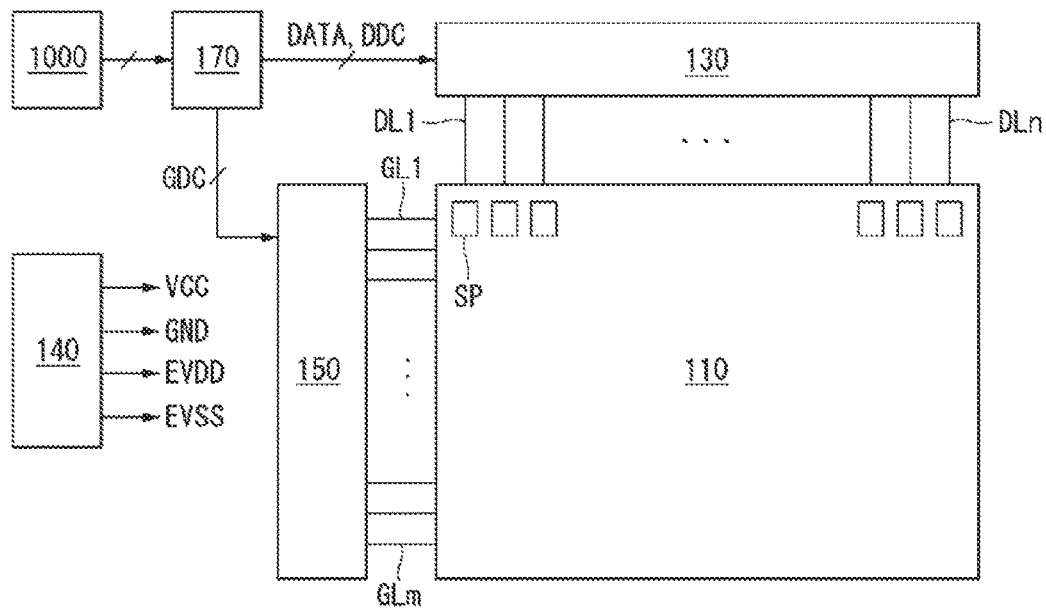
FIG. 1 is a block diagram illustrating a display device according to an embodiment of the present disclosure.
Figure 2:
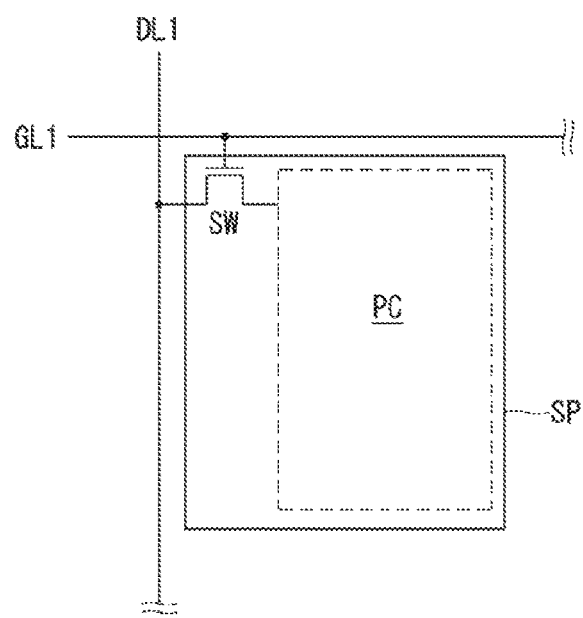
FIG. 2 is a diagram illustrating a subpixel of the display device shown in FIG. 1.
Figure 3:
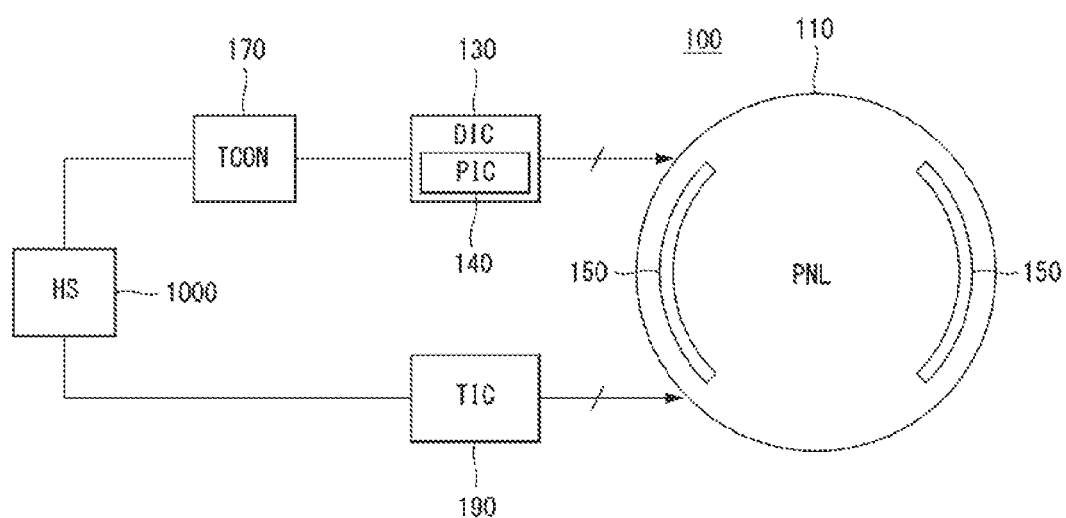
FIG. 3 is a block diagram illustrating a smart watch according to an embodiment of the present disclosure.

FIG. 1 is a block diagram illustrating a display device according to an embodiment of the present disclosure, FIG. 2 is a diagram illustrating a subpixel of the display device shown in FIG. 1, and FIG. 3 is a block diagram illustrating a smart watch according to an embodiment of the present disclosure. All the components of the display device and the smart wat according to all embodiments of the present disclosure are operatively coupled and configured.

As illustrated in FIG. 1, the display device includes a host system 1000, a timing controller 170, a data driver 130, a power supply unit 140, a gate driver 150, and a display panel 110.

The host system 1000 includes a System on Chip (SOC) having a scaler embedded therein, and converts digital video data of a received image into a data signal in a format that is suitable for displaying the image on the display panel 110 and then outputs the digital signal. The host system 1000 supplies various timing signals along with the data signal to the timing controller 170.

The timing controller 170 controls operation timing of the data driver 130 and the gate driver 150 based on a timing signal received from the host system 1000, such as a vertical synchronization signal, a horizontal synchronization signal, a data enable signal, and a main clock. The timing controller 170 performs image processing (data compensation) on the data signal received from the host system 1000, and supplies the resulting data signal to the data driver 130.

The data driver 130 operates in response to a first driving signal DDC output from the timing controller 170. The data driver 130 converts a data signal DATA in a digital format, received from the timing controller 170, into a data signal in an analog format, and outputs the resulting digital signal.

The data driver 130 converts a data signal DATA in a digital format into a digital signal in an analog format in response to a gamma voltage of a gamma voltage disposed inside or outside the data driver 130. The data driver 130 supplies data signals to data lines DL1 to DLn of the display panel 110.

The gate driver 150 operates in response to a second driving signal GDC output from the timing controller 170. The gate driver 150 outputs a gate signal (or a scan signal) at a gate high voltage or gate low voltage.

The gate driver 150 may sequentially output gate signals in a forward or reverse direction. The gate driver 150 supplies the gate signals to gate lines GL1 to GLm of the display panel 110.

The power supply unit 140 outputs first power voltages VCC and GND for driving the data driver 130, and second power voltages EVDD and EVSS for driving the display panel 110. In addition, the power supply unit 140 generates a voltage required to drive the display device, such as a gate high voltage or a gate low voltage to be transmitted to the gate driver 150.

The display panel 110 includes subpixels SPs, the data lines DL1 to DLn connected to the subpixels SPs, and the gate lines GL1 to GLm connected to the subpixels SPs. The display panel displays an image in response to a gate signal output from the gate driver 140 and a data signal DATA output from the data driver 130. The display panel 110 includes a lower substrate and an upper substrate. The subpixels SPs are formed between the lower substrate and the upper substrate.

As illustrated in FIG. 2, each subpixel SP includes a switching thin film transistor SW connected to (or formed at an intersection of) the corresponding gate line (GL1 in this example) and the corresponding data line (DL1), and a pixel circuit (PC) configured to operate in response to a data signal DATA supplied through the switching thin film transistor SW.

The display panel 110 is implemented as a Liquid Crystal Display (LCD) panel or an Organic Light Emitting Display (OLED) panel. When the display panel 110 is implemented as the LCD panel, the display panel 110 operates in Twisted Nematic (TN) mode, a Vertical Alignment (VA) mode, an In Plane Switching (IPS) mode, a Fringe Field Switching (FFS) mode, or an Electrically Controlled Birefringence (ECB) mode.

When the display panel 110 is implemented as the OLED panel, the display panel 110 is a top-emission type, a bottom-emission type, or a dual-emission type.

The aforementioned display device may be implemented as a television, a set-top box, a navigation system, a video player, a Blu-ray player, a personal computer (PC), a wearable device, a home theater, a mobile phone, etc.

In addition, the display panel of the display device may be selected from among a LCD panel, an OLED panel, an electrophoretic indication display, and a plasma display panel. For convenience of explanation, the following description is about an example in which the display panel of the display device is implemented as an OLED panel.

The display panel described in the following may be provided in small, medium, or large size. However, the display panel described in the following is more effective when it is used in small and medium-sized device having a non-display area which has an insufficient margin area.

Hereinafter, a smart watch, which is a small-sized display device, is described as an embodiment of the present disclosure. In addition, in the display panel of the smart watch, subpixels used are preferably red, green, and blue subpixels (RGB), but other combinations of the subpixel colors can be used. All aspects of the present disclosure are not limited thereto.

As illustrated in FIG. 3, a smart watch 100 includes a host system HS 1000, a timing controller TCON 170, a data driver DIC 130, a power supply unit PIC 140, a gate driver 150, a display panel PNL 110, and a touch driver 190.

The smart watch 100 is a small-sized display device. Some components of a small-sized display device are integrated to reduce complexity of the device. For example, the power supply unit 140 is included in the data driver 130. However, this is merely exemplary, and the small-sized device may be implemented in various ways. In another example, the timing controller 170 and the data driver 130 may be integrated.

In addition, the gate driver 150 is embedded in the display panel 110 along with a pixel array. The gate driver 150 embedded in the display panel 110 is formed as a Gate In Panel (GIP) type in a thin film transistor process.

The smart watch 100 includes a touch driver 190 which is a touch-type input means to assist a user to apply an input. In addition, the display panel 110 includes touch sensors to sense a location of a touch input using the touch drive 190 and output the sensed location, and sensor lines electrically connecting the touch sensors and the touch driver 190.

The touch driver 190 detects touch location information of a finger using a touch sensor that is implemented as a self-capacitive touch sensor or mutual-capacitive touch sensor. The touch driver 190 transmits the detected touch location information of a finger to the host system 1000. The host system 1000 executes an application program that is associated with the touch location information received from the touch driver 190.

The touch panel 110 of the smart watch 100 has, for example, a round shape. However, it is merely exemplary, and the display panel 110 may be in various shapes, such as a square, a rectangle, a polygon, and an eclipse.

As to a small-sized display device, such as the smart watch 100, it may be necessary to bend part of the display panel 110 or part of a film connected to the display panel 110 according to size, shape, or an application.

If the display device has a bending area, it may add difficulty to the attachment process. In addition, a crack in a signal line could occur, so it may be regarded a challenge of process control and quality control.

Therefore, if the display panel has a bending area, a design method is required, which is capable of solving the difficulty in the attachment process and preventing a crack in a signal line.

Hereinafter, a design method according to an experiment example is described, and then one or more embodiments of the present disclosure are provided which solve or address the problem(s) and limitation(s) associated with the experiment example.

<Structure of Experiment Example>

Figure 4:
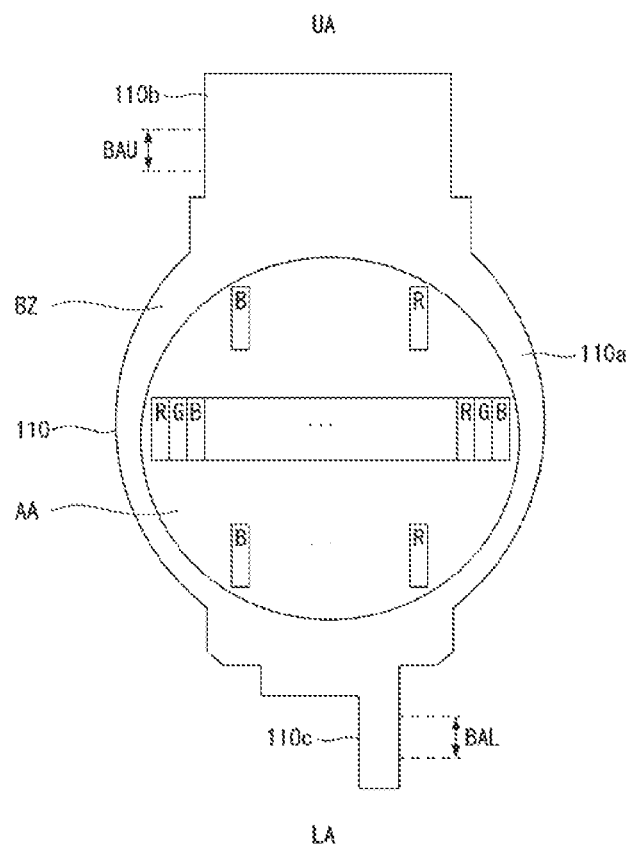
FIG. 4 is a top plan view of a smart watch implemented in a method of an experiment example.
Figure 5:
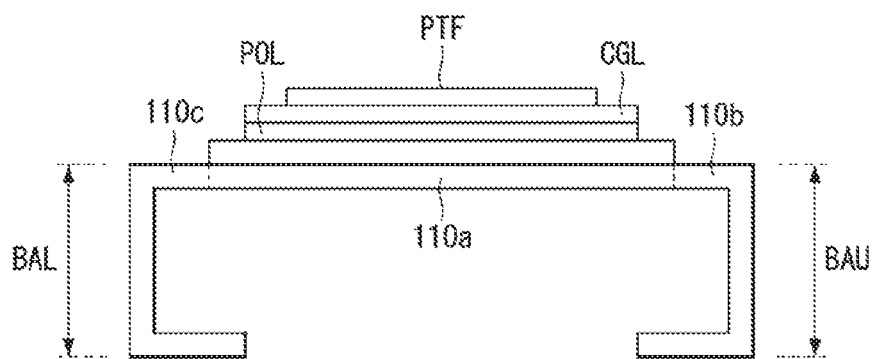
FIG. 5 is a cross-sectional view of a smart watch implemented in a method of the experiment example.
Figure 6:
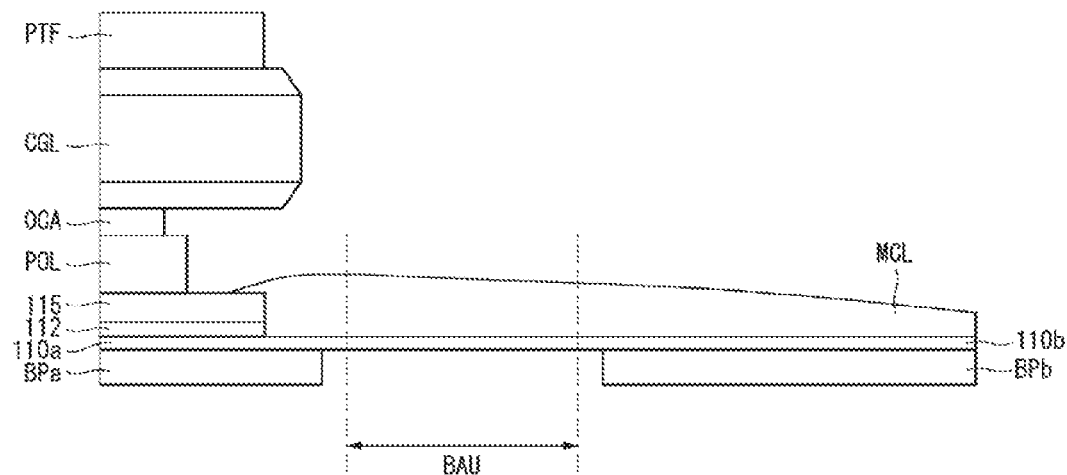
FIG. 6 is a cross-sectional view of an upper bending area of a smart watch implemented in a method of the experiment example
Figure 7:
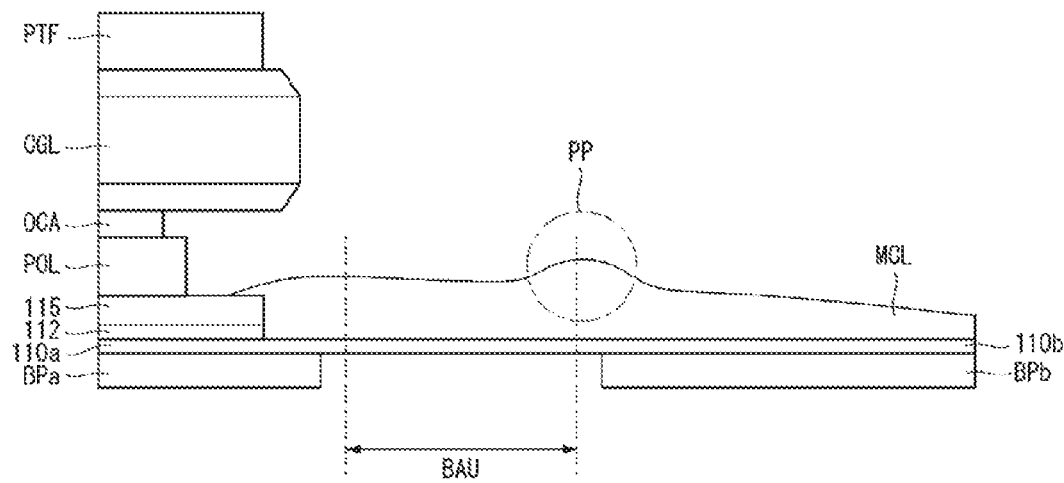
FIG. 7 is a cross-sectional view for explanation of the problem of the experiment example.

FIG. 4 is a top plan view of a smart watch implemented in a method of the experiment example, FIG. 5 is a cross-sectional view of a smart watch implemented in a method of the experiment example, FIG. 6 is a cross-sectional view of an upper bending area of a smart watch implemented in a method of the experiment example, and FIG. 7 is a cross-sectional view for explanation of the problem of the experiment example.

As illustrated in FIGS. 4 and 5, a display panel 110 includes a display area AA in which an image is displayed, and a non-display area (or a bezel area) BZ in which an image is not displayed. On the display area AA of the display panel 110, red subpixels (R), green subpixels (G), and blue subpixels (B) are disposed.

Bending areas BAU and BAL are disposed on the non-display area BZ of the display panel 110. An upper bending area BAU is disposed on a non-display area which is located in the upper area UA of the display panel 110, and a lower bending area BAL is disposed on a non-display area which is located in the lower area LA of the display panel 110.

In the drawings, the upper and lower bending areas BAU and BAL are depicted as being cut in different shapes (in shapes having different width), but they are not limited thereto. That is, the shape of the upper and lower bending areas BAU and BAL may be changed according to how a smart watch is implemented.

As to each of the upper and lower bending areas BAU and BAL, one side and the other side are able to be bent at 90 degrees. Accordingly, an extension area of a lower film of the display panel 110 is in a ⊂ shape or in-a U shape rotated by 90 degrees.

As illustrated in FIGS. 4 to 7, the display panel 110 includes a lower film 110a, 110b, and 110c, a sealing layer 112, and an upper film 115. On the rear surface of the display panel 110, a back plate BPa and BPc is attached.

On the front surface (the display surface) of the display panel 110, a polarizer POL, a cover bonding layer OCA, a cover (or a cover window) CGL, and a protective layer PTF. However, these are merely exemplary components attached onto the front and rear surfaces of the display panel 110, and the components are not limited thereto.

A transparent film is selected for each of the lower film 110a, 110b, and 110c, and the upper film 115. The lower film 110a, 110b, and 110c is divided into a first lower film 110a defined as a display area, a second lower film 110b extended toward one side of the first lower film 110a, and a third lower film 110c extended toward to other side (which is opposite to one side) of the first lower film 110a.

Subpixels are formed between the first lower film 110a and the upper film 115. The upper film 115 is in size corresponding to that of the first lower film 110a. The first lower film 110a and the upper film 115 are sealed by the sealing layer 112. The sealing layer 112 is made of an adhesive or sticky material which is excellent in permeability (or light transmission).

The back plate BPa and BPb is attached in order to improve rigidity of the first and second lower films 110a and 110b. The back plate BPa and BPb may be, for example, made of a polyethylene phthalate (PET) material. The back plate BPA and BPb is divided into a first back plate BPa disposed to correspond to the first lower film 110a, and a second back plate BPb disposed to correspond to the second lower film 110b. The back plate BPa and BPb is separated to be attached to correspond to the first and second lower films 110a and 110b, except for the upper bending area BAU. Although not illustrated in FIG. 6, the back plate is also disposed on a third lower film.

The polarizer POL is attached onto the upper film 115. The cover bonding layer OCA is attached onto the polarizer POL. The cover CGL is attached onto the cover bonding layer OCA. The protective layer PTF is attached onto the cover CGL.

There is a conventional method in which the display panel 110 is cut by a circular shape, a pad area is provided along the cut edge, a flexible film is attached onto the pad area, and the upper and lower bending areas BAU and BAL are provided in a portion of the flexible film.

In the experiment example, in order to omit (remove) an attachment process for attaching an additional flexible film, the second lower film (an extension area or an extension part) 110b extended from the first lower film 110a of the display panel 110 is provided, and the upper bending area BAU is disposed in a portion of the second lower film 110b. The lower bending area BAL is disposed in the similar way, so detailed description thereof is omitted.

The experiment example is in a structure in which a part of an extension area of a lower film is bent in order to connect an external substrate or film. As a result, it is possible to omit the process of manufacturing an additional flexible film and attaching the additional flexible film onto a pad area, and therefore, a simple module process may be achieved.

The structure of the experiment example may exhibit good bending characteristics because the second lower film 100b alone exists in the upper bending area BAU. However, in this structure, the upper bending area BAU is not rigid enough. To enhance the rigidity, a resin layer MCL is applied on the front surface of the second lower film 110b (which is opposite to a surface on which the back plate is attached). Based on this structure of the experiment example, various experiments have been conducted.

As indicated by "PP" in FIG. 7, the structure of the experiment example has problems about non-uniform application of the resin layer MCL (problems caused by an unapplied part, bubbles, thickness, etc.). Thus, it is necessary to control uniform application of the resin layer MCL.

In addition, the structure of the experiment example inevitably requires investment into infrastructure to apply an adhesive material, such as the resin layer MCL. In addition, to use additional equipment and materials, additional steps need to be added to the manufacturing process. Therefore, it is found that the experiment example cannot be a solution of the problems which occur the bending area.

After many experiments, the present inventors discovered that the following structure of the embodiment(s) of the present disclosure has proved to bring about significant effects and advantages compared to that of the experiment example.

<Structure of Embodiment>

Figure 8:
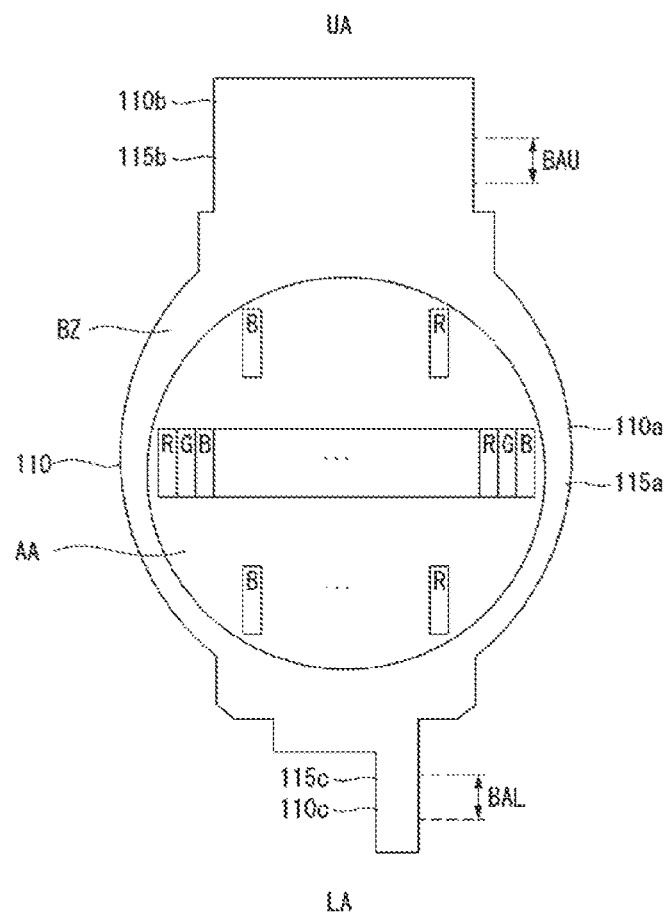
FIG. 8 is a top plan view illustrating a smart watch implemented in a method according to an embodiment of the present disclosure.
Figure 9:
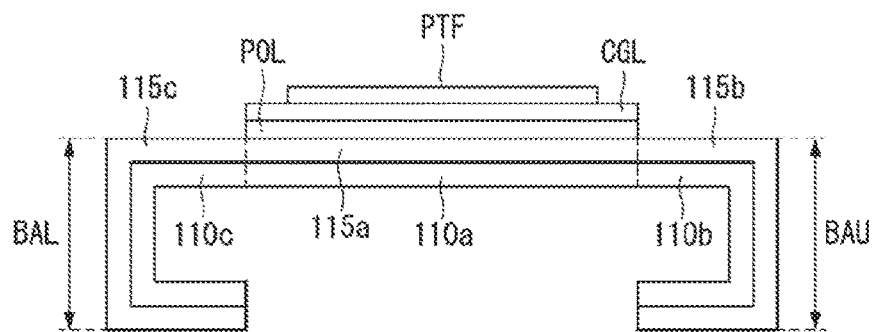
FIG. 9 is a cross-sectional view illustrating a smart watch implemented in a method according to an embodiment of the present disclosure.
Figure 10:
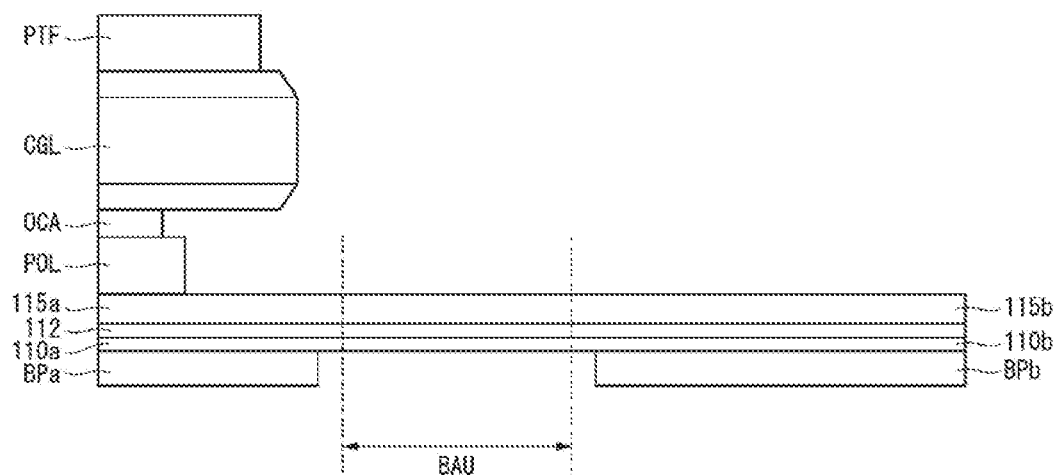
FIG. 10 is a cross-sectional view of an upper bending area of a smart watch implemented in a method according to an embodiment of the present disclosure.

FIG. 8 is a top plan view illustrating a smart watch implemented in a method according to an embodiment of the present disclosure, FIG. 9 is a cross-sectional view illustrating a smart watch implemented in a method according to an embodiment of the present disclosure, and FIG. 10 is a cross-sectional view of an upper bending area of a smart watch implemented in a method according to an embodiment of the present disclosure.

As illustrated in FIGS. 8 and 9, a display panel includes a display area AA in which an image is displayed, and a non-display area (or a bezel region) BZ in which an image is not displayed. In the display area AA of the display panel 110, red subpixels (R), green subpixels (G), and blue subpixels (B) are disposed.

On the non-display area BZ of the display panel 110, bending areas BAU and BAL are disposed. The upper bending area BAU is disposed in a non-display area which is located in the upper area UA of the display panel 110, and the lower bending area BAL is disposed in non-display area which is located is the lower area LA of the display panel 110.

In the drawings, the upper and lower bending areas BAU and BAL are depicted as being cut in different shapes (in shapes having different width), but they are not limited thereto. That is, the shape of the upper and lower bending areas BAU and BAL may be changed according to how a smart watch is implemented.

In each of the upper and lower bending areas BAU and BAL, one side and the other side are able to be bent at 90 degrees. Accordingly, an extension area of a lower film of the display panel 110 is in a ⊂ shape or in a U shape rotated by 90 degrees.

Meanwhile, the drawings show an example in which the upper and lower bending areas BAU and BAL have the same length and are bent at 90 degrees. However, this is merely an example, and the bent angle may be different according to how a smart watch is implemented.

As illustrated in FIGS. 8 and 10, the display panel 110 includes a lower film 110a, 110b, and 110c, a sealing layer 112, and an upper film 115a, 115b, and 115c. On the rear surface of the display panel 110, a back plate BPa and BPc is attached.

On the front surface (the display surface) of the display panel 110, a polarizer POL, a cover bonding layer OCA, a cover (or a cover window) CGL, and a protective layer PTF. However, these are merely exemplary components attached onto the front and rear surfaces of the display panel 110, and the components are not limited thereto.

A transparent film is selected for each of the lower film 110a, 110b, and 110c, and the upper film 115a, 115b, and 115c. The lower film 110a, 110b, and 110c is divided into a first lower film 110a defined as a display area, a second lower films 110b extended toward one side of the first lower film 110a, and a third lower film 110c extended toward to other side (which is opposite to one side) of the first lower film 110a.

Similarly, the upper film 115a, 115b, and 115c is divided into a first upper film 115a defined as a display area, a second upper films 115b extended toward one side of the first upper film 115a, and a third upper film 115c extended toward to other side (which is opposite to one side) of the first upper film 115a.

An extension area formed by the second lower film 110b and the second upper film 115b may be in a shape identical to or different from that of an extension area formed by the third lower film 110c and the third upper film 115c. In the structure shown in the drawings, an external substrate having the upper bending area BAU and attached at each end of the second lower film 110b and the second upper film 115b is different from an external substrate having the lower bending area BAL and attached at each end of the third lower film 110c and the third upper film 115c, and therefore, the extension areas are in different shapes.

The extension area formed by the second lower film 110b and the second upper film 115b and the extension area formed by the third lower film 110c and the third upper film 115c may have different shape and length, depending on whether a touch screen is included. For example, since the lower bending area BAL having a touch screen is connected to an external substrate using a connector method, the lower bending area BAL may be formed wider and longer than the upper bending area BAU. In another example, since the upper bending area BAU has various signal lines arranged therein, the upper bending area BAU may be formed wider and longer than the lower bending area BAL.

However, the above is merely exemplary, and the extension area formed by the second lower film 110b and the second upper film 115b and the extension area formed by the third lower film 110c and the third upper film 115c may be in different shape according to a structure (architecture) of a device desired to be implemented.

Subpixels are formed between the first lower film 110a and the first upper film 115a. The subpixels are formed on the first lower film 110a (or the first upper film) by a deposition procedure. The first upper film 115a is in size corresponding to that of the first lower film 110a. The first, second, and third lower films 110a, 110b, and 110c and the first, second, and third upper films 115a, 115b, and 115c are sealed by the sealing layer 112. The sealing layer 112 is made of an adhesive or sticky material which is excellent in permeability (or light transmission).

The display panel 110 may have regions which are divided, as shown in the drawings, by assembling and sealing the lower film 110a, 110b, and 110c and the upper film 115a, 115b, and 115c with the sealing layer 112 and by performing a cutting procedure. However, aspects of the present disclosure are not limited thereto.

The back plate BPa and BPb is attached to improve rigidity of the first and second lower films 110a and 110b. The back plate BPa and BPb may be, for example, made of a polyethylene phthalate (PET) material. The back plate BPA and BPb is divided into a first back plate BPa disposed to correspond to the first lower film 110a, and a second back plate BPb disposed to correspond to the second lower film 110b. The back plate BPa and BPb is separated to be attached to correspond to the first and second lower films 110a and 110b, except for the upper bending area BAU. Further, the back plate is also disposed on a third lower film.

The polarizer POL is attached onto the upper film 115. The cover bonding layer OCA is attached onto the polarizer POL. A high light transmission sealing layer is selected as the cover bonding layer OCA. The cover CGL is attached onto the cover bonding layer OCA. A high transparency plastic or the like is selected as the cover CGL. The protective layer PTF is attached onto the cover CGL. A high transparency film capable of protecting the surface of the cover CGL is selected as the protective film PTF.

In the embodiment(s) of the present disclosure, in order to omit (remove) an attachment procedure for attaching an additional flexible film, the second lower film (an extension area or an extension part) 110b extended from the first lower film 110a of the display panel 110 is provided, and the upper bending area BAU is provided in a portion of the second lower film 110b.

The lower bending area BAL is disposed in the similar way, so the detailed description thereof is omitted or may be brief. In addition, there is a pad area disposed at the end of an extension area of each film in order to connect an external substrate or film.

Even the embodiment of the present disclosure is in a structure in which a part of an extension area of a lower film is bent in order to connect an external substrate or film. As a result, it is possible to omit the procedure of manufacturing an additional flexible film and attaching the additional flexible film onto a pad area, and therefore, a simple module procedure may be achieved.

Even though the structure of the embodiment(s) of the present disclosure includes the upper bending area BAU on which the second lower film 110b, the sealing layer 112, and the second upper film 115b are disposed, it exhibits as good bending characteristics as the experiment example. In addition, the sealing layer 112 and the second upper film 115b, existing in the upper bending area BAU, help to enhance rigidity without the need of applying an additional reinforced layer, such as a resin layer.

In addition, since the bending area is formed by extending the second lower and upper films 110b and 115b from the first lower and upper films 110a and 115a, the structure of the embodiment is able to make the manufacturing process much simpler than that of the experiment example. Besides, the structure of the embodiment does not need a resin layer, and therefore, it is not necessary to consider non-uniform application of resin (the problems caused by an unapplied part, bubbles, thickness, etc.).

Furthermore, since the structure of the embodiment(s) does not use the resin layer, all the additional steps for using additional equipment and materials to the manufacturing process may be omitted, including. Therefore, the method of the embodiment is expected to be used as a solution of the problems which occur in the bending area.

Meanwhile, to further improve bending characteristics of the bending area, the upper film in the embodiment(s) of the present disclosure may be configured as below.

Figure 11:
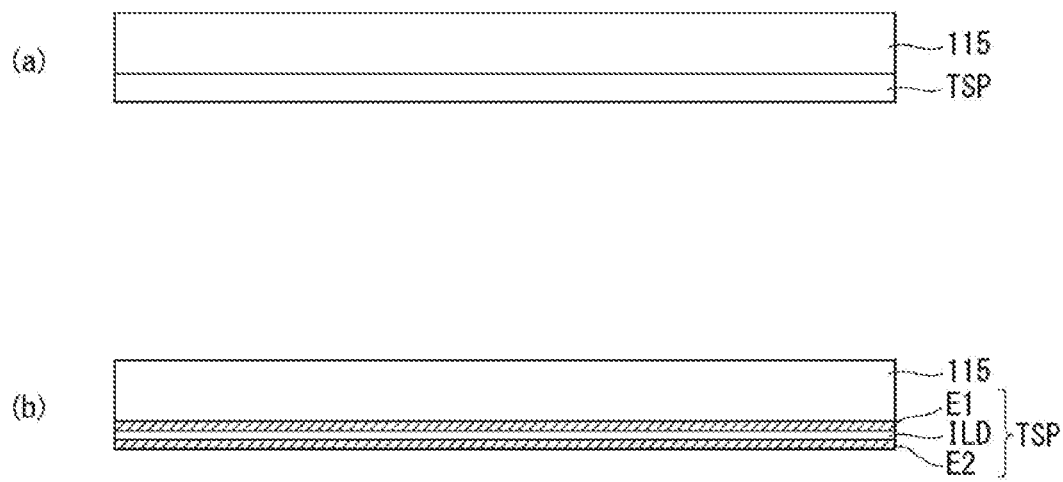
FIG. 11 is a cross-sectional view of an upper film of a smart watch according to an example of the present disclosure.
Figure 12:
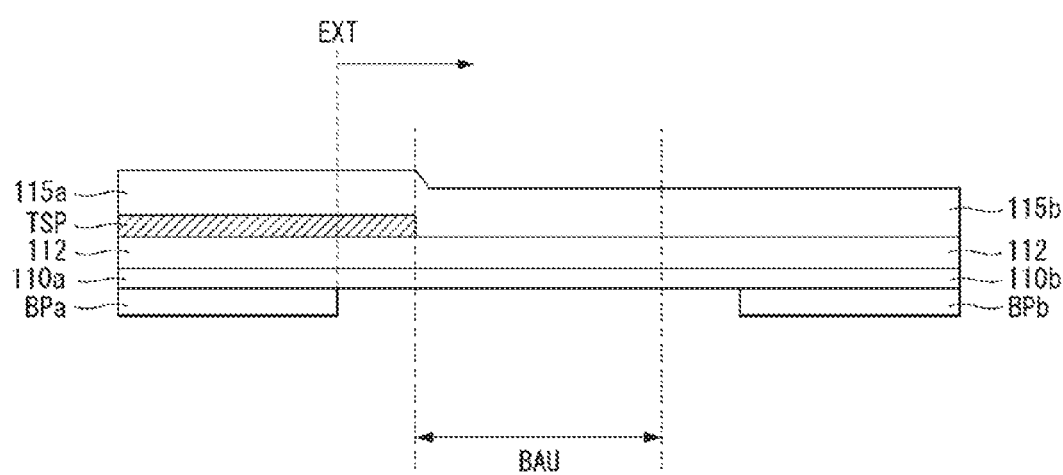
FIG. 12 is a cross-sectional view of an upper bending area of a smart watch implemented in another example of the present disclosure.

FIG. 11 is a cross-sectional view of an upper film of a smart watch according to an example of the present disclosure, and FIG. 12 is a cross-sectional view of an upper bending area of a smart watch implemented in another example of the present disclosure.

As illustrated in FIG. 11, a touch screen layer TSP is attached onto one surface (a surface facing a lower film) of an upper film 115. The touch screen layer TSP is made in the form of a film. The touch screen TSP includes an electrode layer to sense a location of a touch. The electrode layer of the touch screen TSP is formed in an inkjet printing manner or a deposited manner.

The electrode layer of the touch screen TSP may be a single layer as shown in (a) of FIG. 11, or may be multiple layers as shown in (b) of FIG. 11. The multiple-layered touch screen TSP has an insulating layer ILD between a first touch electrode layer E1 and a second touch electrode layer E2.

The electrode layers of the touch screen layer TSP act not just as a touch sensor, but as a sensor line used for electrical connection with a touch driver. Among the electrode layers of the touch screen layer TSP, a layer corresponding to a display area (a first lower film or a first upper film) acts as a touch sensor, and a layer corresponding to a non-display area (a second lower film or a second upper film) acts as a sensor line.

As illustrated in FIG. 12, there is a touch screen TSP between a sealing layer 112 and a first upper film 115a in a display area. However, there is no touch screen TSP between the sealing layer 112 and the second upper film 115b in an upper banding area BAU. In FIG. 12, an extension area of each film starts from a point indicated by EXT.

For example, the touch screen layer PST may be removed to not exist in an area corresponding to the upper bending area BAU or to not exist from the upper bending area BAU to the end of the second lower and upper films 110b and 115b. In another example, the touch screen layer TSP may be removed to not exist from a first back plate BPa to the end of the second lower and upper films 110b and 115b.

The touch screen layer TSP is attached in the form of film onto the first and second upper films 115a and 115b. Thus, if the touch screen layer TSP is extended to the bending area, it may cause damage to a sensor line. To solve this problem, it is possible to delete or remove the touch screen layer TSP only from an area corresponding to the bending area. According to experiment results, if the touch screen layer TSP is removed from the area corresponding to the bending area according to the embodiment of the present disclosure, the bending characteristics may improve further more.

As described above, the present disclosure suggests extending a film of a touch panel, instead of attaching an additional flexible film (e.g., a flexible printed circuit board (FPCB)) for electrical connection with an external device (e.g., a substrate and a film), and providing a bending area on the extended film, so that a simple manufacturing process of a display panel may be achieved. In addition, the present disclosure utilizes the bending characteristics of the bending area extended from the display panel and a rigid structure, so that it is not necessary to form an additional reinforced layer and make investment into infrastructure for an application procedure and possible to remove the additional steps for using additional equipment and materials to the manufacturing process. Furthermore, the present disclosure is able to solve the problems, which occur in the bending area, thus improving reliability of a device and a yield rate of production.

What is claimed is:

1. A display device comprising:
    a first lower film, a second lower film extended toward one side of the first lower film, and a third lower film extended toward another side of the first lower film;
    a first upper film, a second upper film extended toward one side of the first upper film, and a third upper film extended toward another side of the first upper film;
    subpixels formed between the first lower film and the first upper film;
    a sealing layer formed between the first to third lower films and the first to third upper films, and
    a touch screen layer disposed between the first to third upper films and the sealing layer,
    wherein the touch screen layer does not exist in a bending area indicating a portion of a film which is able to be bent.

2. The display device of claim 1, wherein the second lower film, the second upper film, the third lower film, and the third upper film have extension areas.

3. The display device of claim 2, wherein the second lower film and the second upper film have a first bending area which is a bendable portion of the extension area of the second lower film and the second upper film, and
    wherein the third lower film and the third upper film have a second bending area which is a bendable portion of the extension area of the third lower film and the third upper film.

4. The display device of claim 2, further comprising a back plate attached onto a rear surface of the first to third lower films,
    wherein the back plate does not exist in the bending area indicating the portion of the film which is able to be bent.

5. The display device of claim 1, wherein a display area formed by the first lower film and the first upper film has a round, square, polygon, or eclipse shape.

6. The display device of claim 1, wherein the touch screen layer exists in a display area between the first lower film and the first upper film, and exists either in an extension area of the second lower film and the second upper film or in an extension area of the third lower film and the third upper film.

7. A method of manufacturing a display device, the method comprising:

forming subpixels on a lower film;

performing a bonding and sealing procedure of disposing an upper film on the lower film and providing a sealing layer and a touch screen layer between the lower film and the upper film; and performing a film cutting procedure so that the lower film has a first lower film, a second lower film extended toward one side of the first lower film, and a third lower film extended toward another side of the first lower film, and the upper film has a first upper film, a second upper film extended toward one side of the first upper film, and a third upper film extended toward another side of the first upper film, wherein the touch screen layer does not exist in a bending area indicating a portion of a film which is able to be bent.

8. The method of claim 7, further comprising:

forming a first bending area by bending a portion of the second lower film and a portion of the second upper film; and forming a second bending area by bending a portion of the third lower film and a portion of the third upper film.

* * * * *